US010802526B1

(12) United States Patent
Otsu

(10) Patent No.: US 10,802,526 B1
(45) Date of Patent: Oct. 13, 2020

(54) INPUT CIRCUIT

(71) Applicants: Kabushiki Kaisha Toshiba, Minato-ku, Tokyo (JP); Toshiba Electronic Devices & Storage Corporation, Minato-ku, Tokyo (JP)

(72) Inventor: Hibiki Otsu, Kawasaki Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 16/788,574

(22) Filed: Feb. 12, 2020

(30) Foreign Application Priority Data

Jul. 22, 2019 (JP) .................................. 2019-134352

(51) Int. Cl.
G05F 3/24 (2006.01)
H03K 17/567 (2006.01)
H03K 3/011 (2006.01)
G05F 3/18 (2006.01)

(52) U.S. Cl.
CPC .............. *G05F 3/242* (2013.01); *G05F 3/185* (2013.01); *H03K 3/011* (2013.01); *H03K 17/567* (2013.01)

(58) Field of Classification Search
CPC ... G05F 3/18; G05F 3/185; G05F 3/24; G05F 3/242; H03K 3/011; H03K 17/567
See application file for complete search history.

(56) References Cited

U.S. PATENT DOCUMENTS 6,985,026 B2 * 1/2006 Toyoyama ................ G05F 3/24
                                                    327/540
7,190,195 B2 * 3/2007 Yamamoto ........... H03K 17/223
                                                    327/112
8,319,543 B2   11/2012 Sugawara
9,673,791 B2    6/2017 Wakasugi et al.
9,871,440 B2 *  1/2018 Zhang ..................... H02M 3/00

FOREIGN PATENT DOCUMENTS

| JP | S59-060368 A | 4/1984 |
| JP | 2005-167865 A | 6/2005 |
| JP | 2009-109237 A | 5/2009 |
| JP | 2010-010193 A | 1/2010 |
| JP | 4791943 B2 | 10/2011 |
| JP | 5573048 B2 | 8/2014 |
| JP | 2016-025617 A | 2/2016 |

* cited by examiner

*Primary Examiner* — Patrick O Neill
(74) *Attorney, Agent, or Firm* — White & Case LLP

(57) ABSTRACT

An input circuit according to an embodiment includes an input terminal, a power terminal, an internal circuit, an input section, a power supply section, and a first circuit. The input section includes first and resistive parts, and a first transistor. The first resistive part is connected to the input terminal. The second resistive part is connected to the first resistive part. The gate of the first transistor is connected to the first resistive part. The first circuit includes a fifth resistive part and a third transistor. The fifth resistive part is connected to the second resistive part and a grounding line. The gate and one end of the third transistor are connected to the second resistive part. The other end of the third transistor is connected to the grounding line.

20 Claims, 15 Drawing Sheets

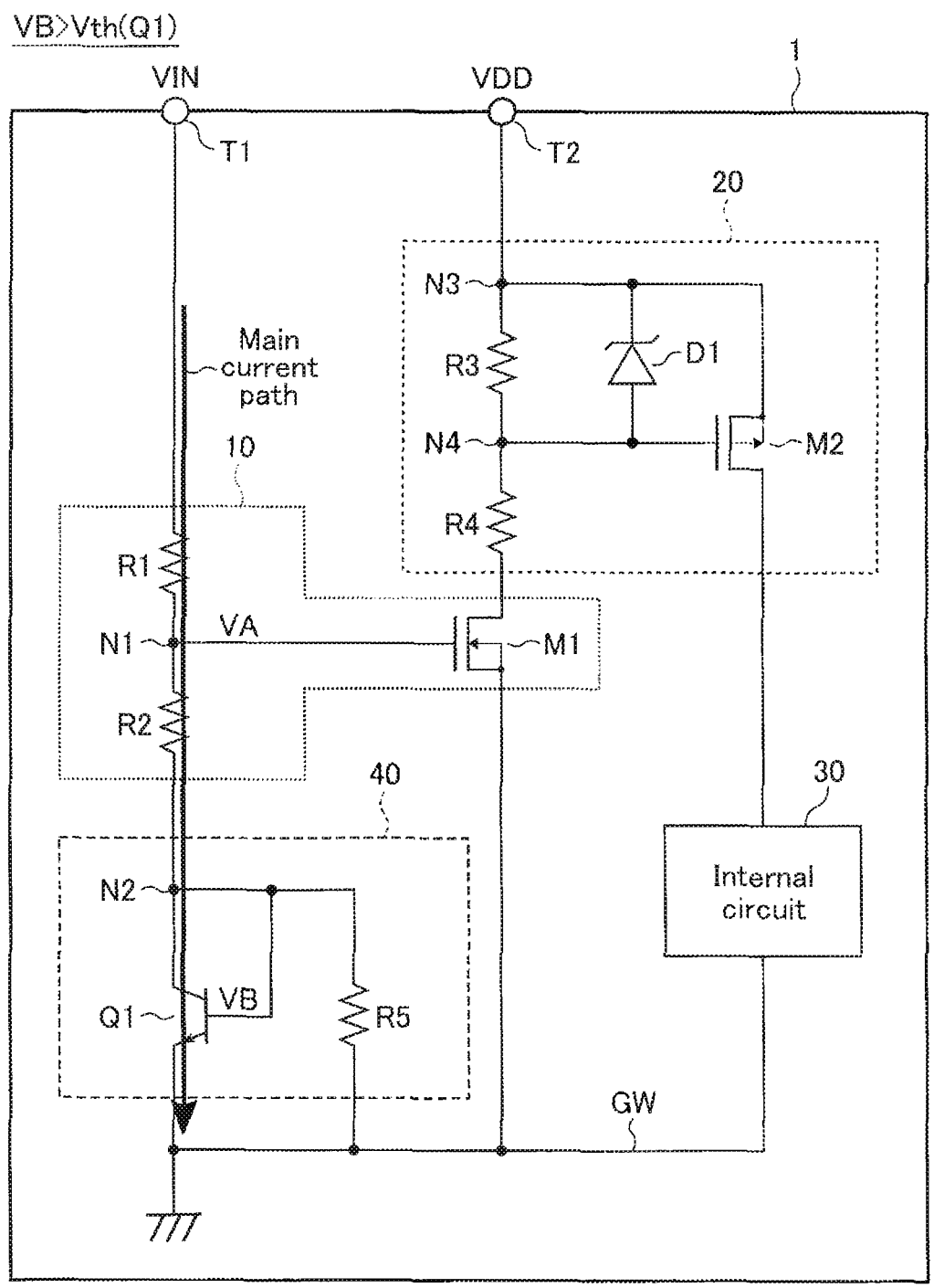
F I G. 3

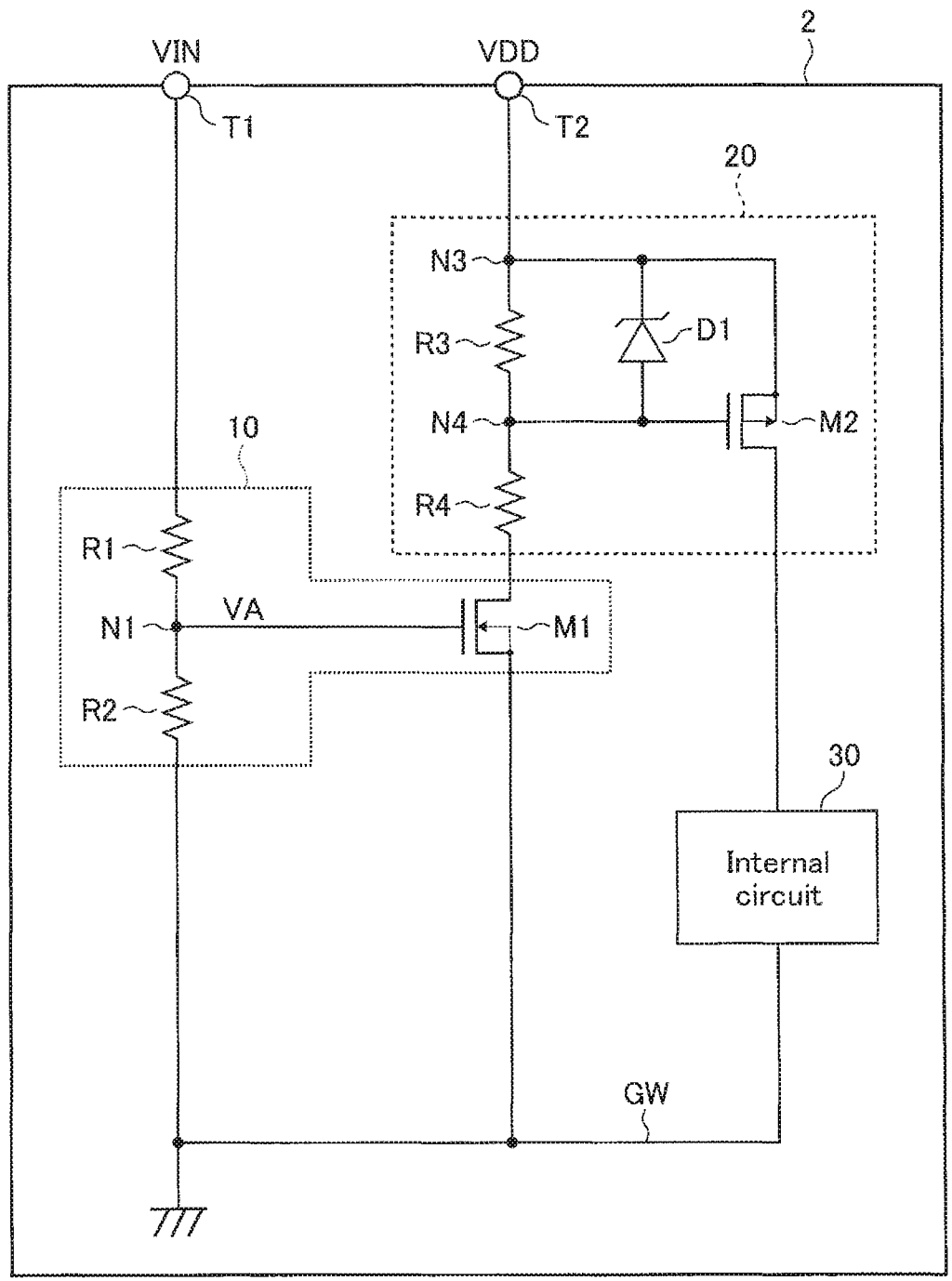
F I G. 5

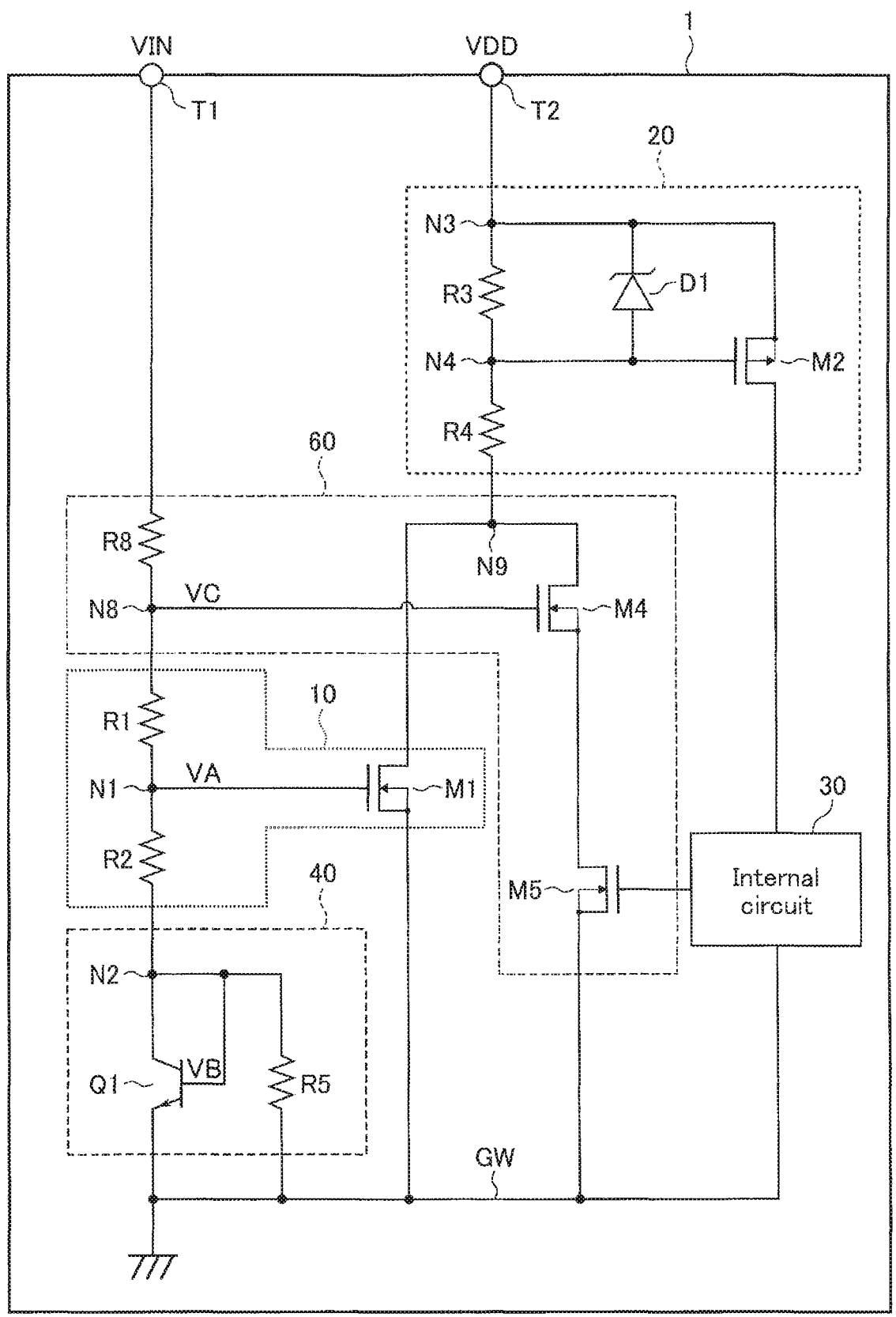
F I G. 12

Causing internal circuit to transition from off state to on state

Causing internal circuit to transition from on state to off state

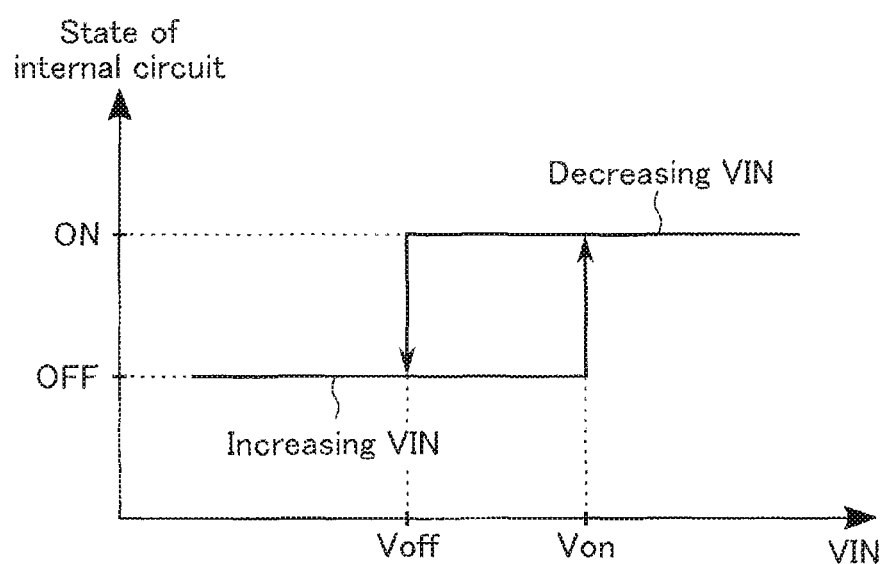
F I G. 15

INPUT CIRCUIT

CROSS-REFERENCE TO RELATED APPLICATIONS

This application is based upon and claims the benefit of priority from Japanese Patent Application No. 2019-134352, filed Jul. 22, 2019, the entire contents of which are incorporated herein by reference.

FIELD

Embodiments relate to an input circuit.

BACKGROUND

An input circuit is known, which is adapted to supply power to its internal circuit according to the size of an input voltage. The input circuit of this type controls whether or not to feed the internal circuit with a power-supply voltage through the use of, for example, a MOS transistor which varies the gate voltage according to the input voltage.

What controls the gate voltage of a MOS transistor is the input voltage not dependent on temperature. Meanwhile, the MOS transistor itself has temperature dependency and could vary its threshold voltage depending on temperature. In the input circuit as such, an input threshold for dealing with the on/off switching of the internal circuit may have temperature dependency that follows the temperature characteristics of the MOS transistor.

An input circuit, when there is another power supply available for its input-voltage receiving circuitry, can suppress the temperature dependency of the input threshold by operating a comparator, etc., using this another power supply. However, for adopting a system that turns off the internal power supply for the sake of reducing the consumption of electric current during a standby state, a comparator or the like cannot be used to set the threshold. While the input threshold is settable even without an internal power supply if the input-voltage receiving circuitry is adapted to control the MOS transistor based only on the input voltage, the temperature dependency of the input threshold would then be difficult to suppress.

BRIEF DESCRIPTION OF THE DRAWINGS

FIG. 3 is a diagram showing one example of another current path during operation of the input circuit according to the first embodiment.

FIG. 5 is a circuit diagram showing one exemplary circuit configuration of an input circuit according to a comparative example to the first embodiment.

FIG. 12 is a circuit diagram showing one exemplary circuit configuration of an input circuit according to a fourth embodiment.

FIG. 15 is a diagram showing one example of a relationship between an input threshold for turning on the internal circuit and an input threshold for turning off the internal circuit in the input circuit according to the fourth embodiment.

DETAILED DESCRIPTION

In general, according to one embodiment, an input circuit includes an input terminal, a power terminal, an internal circuit, an input section, a power supply section, and a first circuit. There is a grounding line connected to the ground. The internal circuit is connected to the grounding line. The input section includes a first resistive part, a second resistive part, and a first transistor. One end of the first resistive part is connected to the input terminal. One end of the second resistive part is connected to the other end of the first resistive part. The gate of the first transistor is connected to the other end of the first resistive part. The power supply section includes a third resistive part, a fourth resistive part, and a second transistor. One end of the third resistive part is connected to the power terminal. One end of the fourth resistive part is connected to the other end of the third resistive part. The other end of the fourth resistive part is connected to one end of the first transistor. The gate of the second transistor is connected to the other end of the third resistive part. One end of the second transistor is connected to the power terminal. The other end of the second transistor is connected to the internal circuit. The first circuit includes a fifth resistive part and a third transistor. One end of the fifth resistive part is connected to the other end of the second resistive part. The other end of the fifth resistive part is connected to the grounding line. The gate and one end of the third transistor are connected to the other end of the second resistive part. The other end of the third transistor is connected to the grounding line.

Now, the embodiments will be described with reference to the drawings. Each embodiment will exemplify devices and methods for embodying the technical idea of the invention. The drawings are schematic or conceptual, and it is not a requisite that the dimensions, scales, etc., read from each drawing conform to actual products. The technical idea of the invention is not bound by particular component shapes, structures, arrangements, etc. The description will use same reference symbols for the structural features or components having the same or substantially the same functions and configurations. Numerals may be added after reference symbol-constituting characters in order to differentiate between elements that are denoted by reference symbols of the same characters and that have substantially the same configurations.

[1] First Embodiment

An input circuit 1 according to the first embodiment will be described.

[1-1] Circuit Configuration of Input Circuit 1

Figure 1:
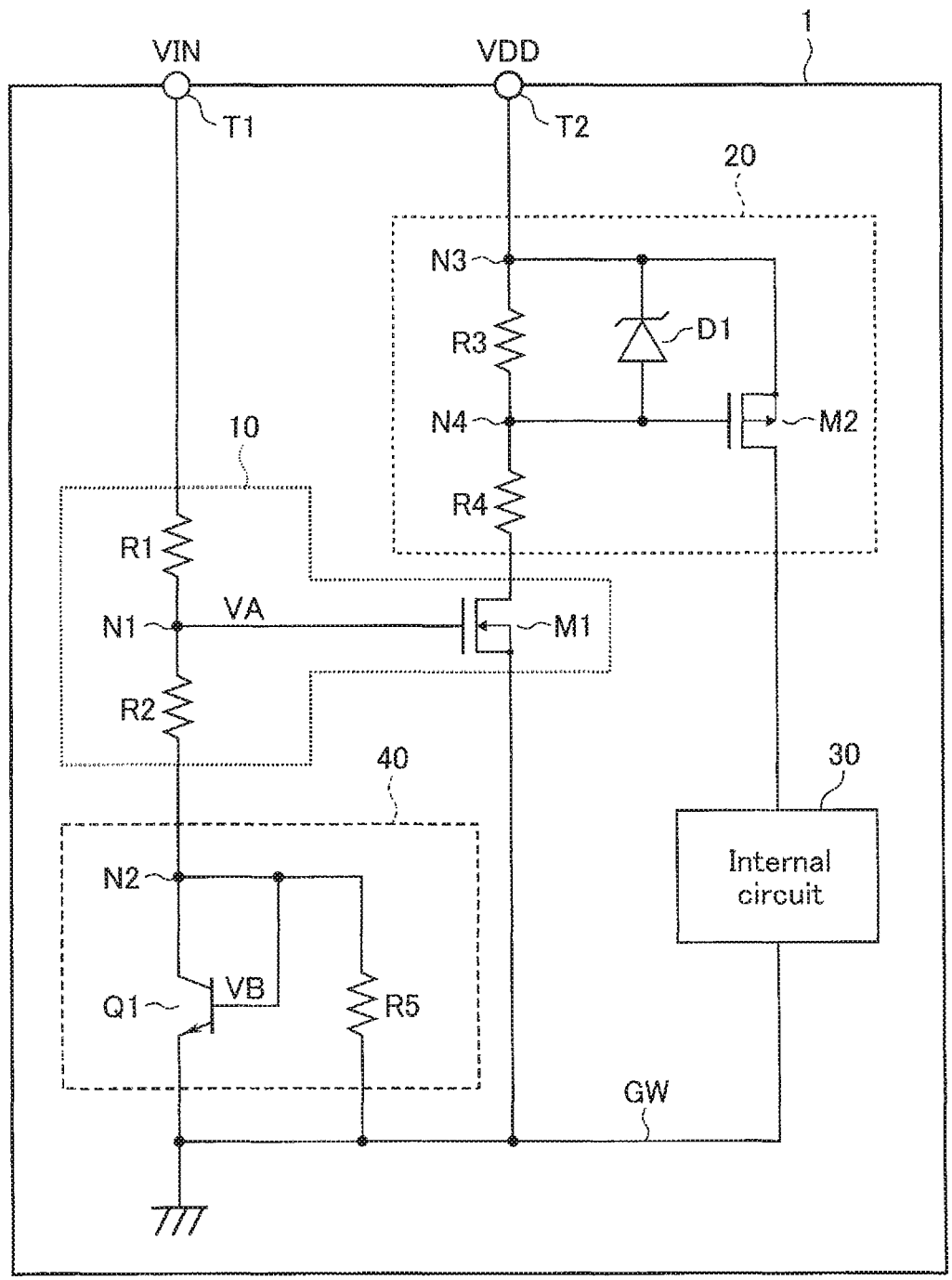
FIG. 1 is a circuit diagram showing one exemplary circuit configuration of an input circuit according to a first embodiment.

FIG. 1 shows one exemplary circuit configuration of the input circuit 1 according to the first embodiment. As shown in FIG. 1, the input circuit 1 includes, for example, an input terminal T1, a power terminal T2, a grounding line GW, an input section 10, a power supply section 20, an internal circuit 30, and an adjusting circuit 40.

The input terminal T1 is used for on/off controlling the internal circuit 30. The input terminal T1 is adapted for external connection with, for example, a host device such as a microcomputer, etc., and receives an input voltage VIN. The input voltage VIN may be a signal generated by the host device, the microcomputer, etc.

The power terminal T2 is used for supplying a power-supply voltage to the internal circuit 30. The power terminal T2 is adapted for connection with, for example, a battery, etc., and receives a power-supply voltage VDD. The power-supply voltage VDD is in principle higher than the ground voltage of the input circuit 1.

The grounding line GW is a wire or an interconnect to the ground of the input circuit 1. For example, a voltage of the grounding line GW corresponds to the ground voltage of the input circuit 1. The grounding line GW may be divided or branched, as it would serve the purpose if at least each branch of the grounding line GW is grounded.

The input section 10 includes a transistor M1, and resistive parts R1 and R2. The transistor M1 in this example is an N-type MOS transistor. The transistor M1 has its gate connected to a node N1. The resistive part R1 has one end connected to the input terminal T1. The other end of the resistive part R1 is connected to the node N1. The resistive part R2 has one end connected to the node N1 and the other end connected to a node N2.

The power supply section 20 includes a transistor M2, resistive parts R3 and R4, and a diode D1. The transistor M2 here is a P-type MOS transistor. The transistor M2 has its gate connected to a node N4. The source of the transistor M2 is connected to the power terminal T2 via a node N3. The resistive part R3 has one end connected to the node N3 and the other end connected to the node N4. One end of the resistive part R4 is connected to the node N4. The diode D1 here is a Zener diode. The diode D1 has an anode and a cathode, which are connected to the node N4 and the node N3, respectively.

The internal circuit 30 is a circuit that provides a function for use by the host device or a user. The internal circuit 30 is connected between the drain of the transistor M2 and the grounding line GW. For example, if the input circuit 1 is a lamp device for a vehicle, the internal circuit 30 corresponds to a circuit for controlling the lamp. The input circuit 1 in this case is connected to a controller and a battery installed in the vehicle. The on/off switching of the lamp is controlled according to instructions from the controller.

The adjusting circuit 40 includes a transistor Q1 and a resistive part R5. The transistor Q1 here is an NPN-type bipolar transistor. The transistor Q1 has a threshold voltage Vth(Q1) designed to be lower than the threshold voltage Vth(M1) of the transistor M1. The transistor Q1 has its base and collector connected to the node N2. The emitter of the transistor Q1 is connected to the grounding line GW. In other words, the transistor Q1 is arranged in diode connection between the node N2 and the grounding line GW. The resistive part R5 has one end connected to the node N2. The other end of the resistive part R5 is connected to the grounding line GW. The resistive part R5 has a resistance value greater than the on-resistance of the transistor Q1.

For the input circuit 1 with the circuit configuration having been described, the resistance values of the resistive parts R1 and R2 are designed based on the threshold voltage Vth(M1) of the transistor M1. The resistance values of the resistive parts R3 and R4 are designed based on the threshold voltage Vth(M2) of the transistor M2. The diode D1 is adapted to protect the transistor M2 by keeping the voltage of the node N4 constant in the event that the difference in voltage between the node N3 and the node N4 exceeds the Zener voltage Vz(D1) of the diode D1. The Zener voltage Vz(D1) is designed based on the withstanding capability of the transistor M2. In the following description, the voltage applied to the gate of the transistor M1, i.e., the voltage of the node N1, will be denoted as "VA". The voltage applied to the gate of the transistor Q1, i.e., the voltage of the node N2, will be denoted as "VB".

[1-2] Operations of Input Circuit 1

Description will be given of how the input circuit 1 according to the first embodiment operates. Note that the description will use a reference symbol alone when the resistance value of the corresponding component or element is meant. For example, use of "R1" alone will mean the resistance value of the resistive part R1, and use of "Q1" alone will mean the value of resistance between the collector and the emitter of the transistor Q1, i.e., the on-resistance of the transistor Q1.

In the input circuit 1, when the input voltage VIN is lower than the input threshold, the voltage VA of the node N1 falls below the threshold voltage Vth(M1) of the transistor M1, and the transistor M1 as an N-type transistor keeps the off state. At this time, the node N4 shows the voltage of the "H" level in the power supply section 20, because of the transistor M1 being in the off state. Accordingly, the transistor M2 as a P-type transistor keeps the off state, and a supply of power from the transistor M2 to the internal circuit 30 is blocked. That is, the internal circuit 30 keeps the off state.

In the input circuit 1, when the input voltage VIN exceeds the input threshold, the voltage VA of the node N1 becomes higher than the threshold voltage Vth(M1) of the transistor M1, and the transistor M1 as an N-type transistor is placed in the on state. When the transistor M1 becomes the on state, a current path is formed between the power terminal T2 and the grounding line GW. The voltage of the node N4 thus descends to the "L" level, and the transistor M2 as a P-type transistor is placed in the on state. As a result, the power supply from the transistor M2 to the internal circuit 30 begins so that the internal circuit 30 is allowed to start its operation. That is, the internal circuit 30 becomes the on state.

In the input circuit 1 according to the first embodiment, the main current path running through the adjusting circuit 40 changes based on the voltage VB of the node N2 in the course of the input voltage VIN being increased from the ground voltage. More specifically, the main current path changes in the adjusting circuit 40 depending on whether or not the voltage VB of the node N2 is equal to or higher than the threshold voltage Vth(Q1) of the transistor Q1.

Figure 2:
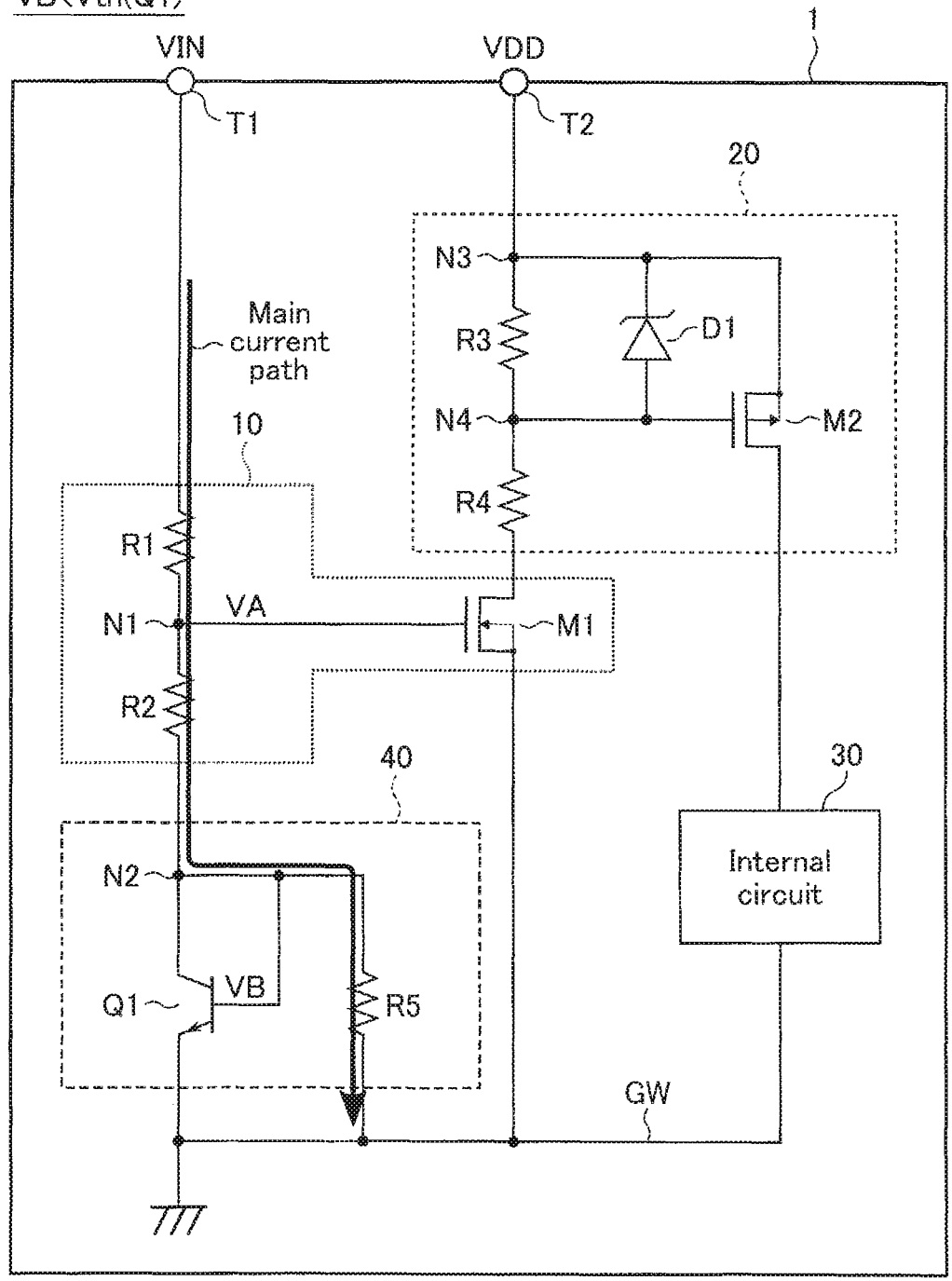
FIG. 2 is a diagram showing one example of a current path during operation of the input circuit according to the first embodiment.

FIG. 2 shows one example of the current path formed during the operation of the input circuit 1 according to the first embodiment, and this example corresponds to an exemplary operation performed when the voltage VB is lower than the threshold voltage Vth(Q1). As shown in FIG. 2, when VB is lower than Vth(Q1), the main current path between the input terminal T1 and the grounding line GW is routed through the resistive parts R1, R2, and R5. In this instance, the voltage VA of the node N1 is calculated by the following expression (1).

$$VA=VIN*(R2+R5)/(R1+R2+R5) \quad (1)$$

FIG. 3 shows one example of the current path formed during the operation of the input circuit 1 according to the first embodiment, and this example corresponds to an exemplary operation performed when the voltage VB is equal to or higher than the threshold voltage Vth(Q1). As shown in FIG. 3, when VB is equal to or higher than Vth(Q1), the main current path between the input terminal T1 and the grounding line GW is routed through the resistive parts R1 and R2, and the transistor Q1. In this instance, the voltage VA of the node N1 is calculated by the following expression (2).

$$VA=VIN*(R2+Q1)/(R1+R2+Q1) \quad (2)$$

For example, the on-resistance of the transistor Q1 is negligibly small as compared to the resistance value of the resistive part R5. As such, VA shows an inclination that is smaller (gentler) for the time of VB being equal to or higher than Vth(Q1) than for the time of VB being lower than Vth(Q1). Also, VA for the time of VB being equal to or higher than Vth(Q1) can be given in an approximated form as in the following expression (3).

$$VA=VIN*R2/(R1+R2)+Vth(Q1) \quad (3)$$

Figure 4:
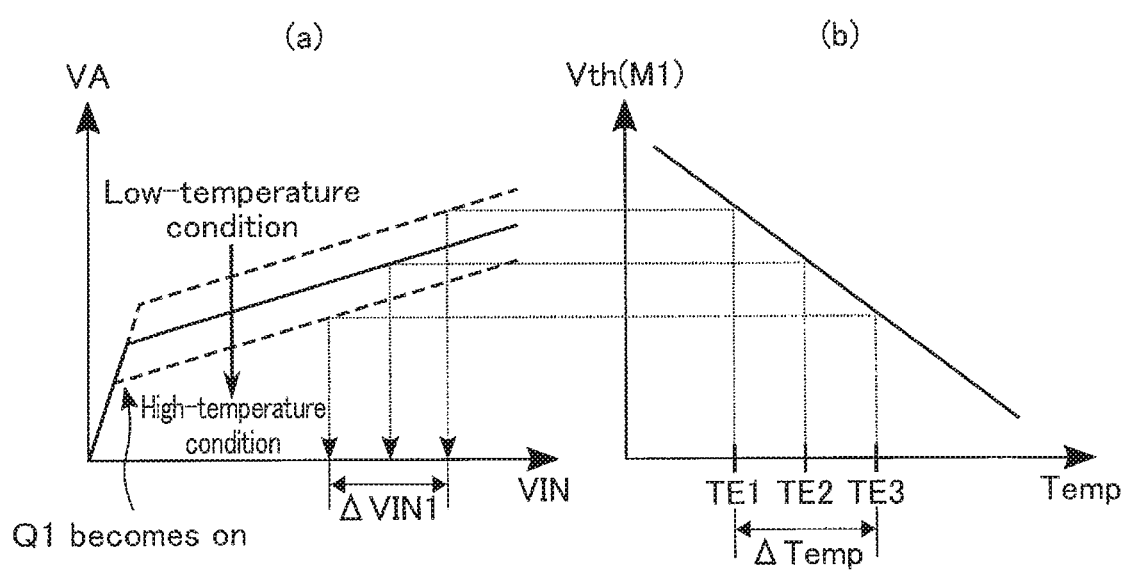
FIG. 4 is a diagram showing one example of a relationship between a gate voltage and an input voltage, together with one example of transistors' temperature dependency, in the input circuit according to the first embodiment.

FIG. 4 shows one example of the relationship between VA and VIN, together with one example of the temperature dependency of the transistors Q1 and M1 in the input circuit 1 according to the first embodiment. The left portion (a) in FIG. 4 is a graph having a vertical axis indicative of the voltage VA of the node N1, and a horizontal axis indicative of the input voltage VIN. Also, the right portion (b) in FIG. 4 is a graph having a vertical axis indicative of the threshold voltage Vth(M1) of the transistor M1, and a horizontal axis indicative of a temperature Temp which is the temperature inside the input circuit 1.

As shown in FIG. 4(a), VA changes the inclination at the boundary between the transistor Q1 being on and the transistor Q1 not being on. More specifically, the inclination of VA when the transistor Q1 is in the off state is represented by, for example, "(R2+R5)/(R1+R2+R5)" given in the expression (1). Also, the inclination of VA when the transistor Q1 is in the on state is represented by, for example, "R2/(R1+R2)" given in the expression (3). That is, according to the first embodiment, the inclination of VA changes from "(R2+R5)/(R1+R2+R5)" to "R2/(R1+R2)" as the transistor Q1 transitions from the off state to the on state.

As shown in FIG. 4(b), the threshold voltage Vth(M1) of the transistor M1 is apt to descend as the temperature Temp increases. For example, supposing that temperatures TE1, TE2, and TE3 are defined in an ascending order, Vth(M1) at the temperature TE1 is higher than Vth(M1) at the temperature TE2, and the Vth(M1) at the temperature TE2 is higher than Vth(M1) at the temperature TE3.

The transistor Q1 as a bipolar transistor has temperature dependency likewise. More specifically, the threshold voltage of a bipolar transistor is apt to descend as the temperature increases, as in the case of, for example, a MOS transistor. As such, in FIG. 4(a), the timing at which the transistor Q1 is placed in the on state comes earlier under a high-temperature condition than under a low-temperature condition. Note that FIG. 4(a) uses a solid line to show the relationship between VA and VIN in the case of the temperature TE2, and uses broken lines to show the relationship between VA and VIN in the respective cases of the temperature TE1 (low-temperature condition) and the temperature TE3 (high-temperature condition).

Under the condition of the temperature TE1, the transistor Q1 turns to the on state at VIN higher than that under the condition of the temperature TE2, and thus, the VA profile or waveform is shifted toward a higher voltage side than the case of the temperature TE2. Under the condition of the temperature TE3, the transistor Q1 turns to the on state at VIN lower than that under the condition of the temperature TE2, and thus, the VA profile or waveform is shifted toward a lower voltage side than the case of the temperature TE2.

As described, the input circuit 1 according to the first embodiment has characteristics that VA steeply rises in the domain of low VIN, while the inclination of VA becomes gentle upon the transistor Q1 having turned to the on state responsive to the increase of VIN. The input circuit 1 according to the first embodiment is further designed so that the transistor M1 can be subjected to on/off control in the domain where the transistor Q1 is in the on state, within, for example, a temperature range that guarantees operations. For explanation, the difference between the temperatures TE1 and TE3 is denoted as "ΔTemp", and the amount of change of the input voltage VIN that corresponds to ΔTemp is denoted as "ΔVIN1".

[1-3] Effects and Advantages of First Embodiment

The input circuit 1 according to the first embodiment having been described can suppress its temperature dependency. The effects provided by the input circuit 1 according to the first embodiment will be described in detail, using a comparative example.

FIG. 5 shows one exemplary circuit configuration of an input circuit 2 that is according to the comparative example to the first embodiment. As shown in FIG. 5, the input circuit 2 according to the comparative example differs from the input circuit 1 according to the first embodiment in that its circuit configuration omits the adjusting circuit 40. More specifically, in the input circuit 2, the other end of the resistive part R2 and the source of the transistor M1 are each directly connected to the grounding line GW.

Figure 6:
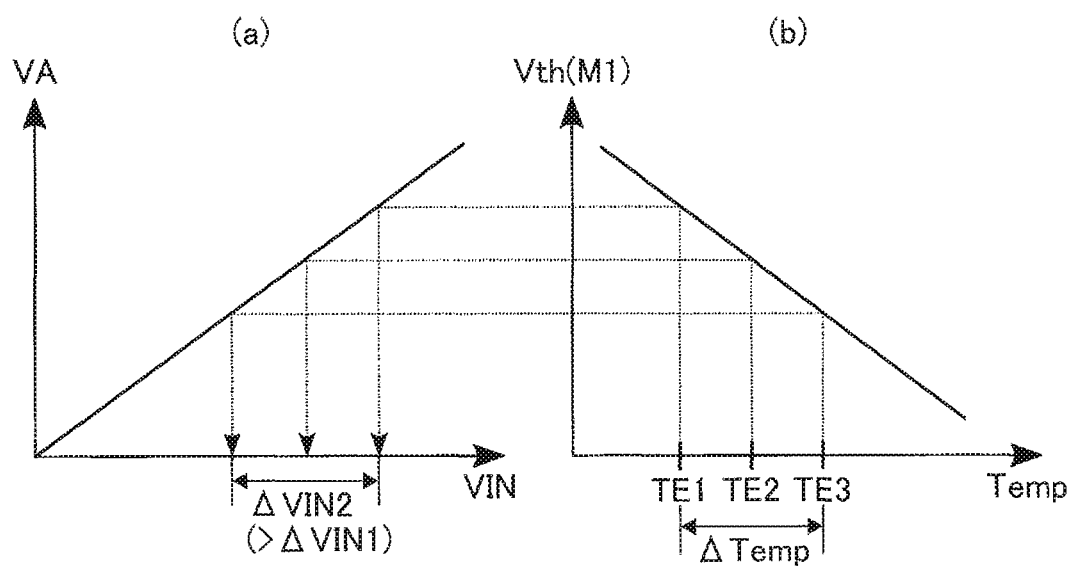
FIG. 6 is a diagram showing one example of a relationship between a gate voltage and an input voltage, together with one example of transistor's temperature dependency, in the input circuit according to the comparative example to the first embodiment.

FIG. 6 shows one example of the relationship between a voltage VA and an input voltage VIN, together with one example of the temperature dependency of the transistors Q1 and M1, in the input circuit 2 according to the comparative example to the first embodiment. Terms of the graphs shown in FIG. 6 are the same as those of FIG. 4 discussed for the first embodiment. As shown in FIG. 6(a), the inclination of VA in the comparative example is substantially constant, and represented by "R2/(R1+R2)". Note that the temperature dependency of the threshold voltage Vth(M1) of the transistor M1, shown in FIG. 6(b), is the same as that shown in FIG. 4(b).

For example, when the threshold voltage Vth(M1) of the transistor M1 in the first embodiment and that in the comparative example are the same, the amount of change, ΔVIN2, of the input voltage VIN that corresponds to the difference ΔTemp between the temperatures TE1 and TE3 in the comparative example is greater than the amount of change, ΔVIN1, in the first embodiment. This is because the input circuit 1 according to the first embodiment has the characteristics of changing the inclination of VA at the threshold voltage Vth(Q1) of the transistor Q1 as a boundary point.

More specifically, in the first embodiment, the main current path between the input terminal T1 and the grounding line GW when the transistor Q1 is in the off state is routed through the resistive part R5. Accordingly, the inclination of VA when the transistor Q1 is in the off state becomes large (steep) according to the resistance value of the resistive part R5. On the other hand, the main current path between the input terminal T1 and the grounding line GW when the transistor Q1 is in the on state is routed through the transistor Q1. Accordingly, the inclination of VA when the transistor Q1 is in the on state becomes small (gentle) according to the on-resistance of the transistor Q1, which is of a smaller resistance value than that of the resistive part R5.

Also, "(R2+R5)/(R1+R2+R5)" in the first embodiment is designed to be greater than, for example, "R2/(R1+R2)" in the comparative example. This allows the VA inclination in the first embodiment for the time of the transistor Q1 being in the off state to be larger (steeper) than the VA inclination in the comparative example. In this manner, by appropriately setting the amount of the VA increase for the time of the transistor Q1 being in the off state, that is, by setting an appropriate resistance ratio among the resistive parts R1, R2, and R5, it is possible to pull up VA to the point close to the threshold voltage Vth(M1) of the transistor M1 before the transistor Q1 reaches the on state.

With this configuration, therefore, the input circuit 1 according to the first embodiment allows for the setting of the input threshold within the range where the transistor Q1 is in the on state. In other words, the input circuit 1 according to the first embodiment enables the on/off control of the transistor M1 in the domain where the transistor Q1 has turned to the on state and the VA inclination has thus become gentle.

Although the transistor Q1 as a bipolar transistor has temperature dependency similar to the transistor M1 as a MOS transistor, the total improvement effect obtained by having the gentle VA inclination to suppress the temperature dependency is more significant than the influence of the temperature dependency of the transistor Q1. The input circuit 1 according to the first embodiment can therefore make the temperature dependency of the input threshold smaller than that of the input circuit 2 according to the comparative example.

As described above, the input circuit 1 according to the first embodiment can suppress the temperature dependency of the input threshold by combining the transistor M1 as a MOS transistor and the transistor Q1 as a bipolar transistor. Also, the input circuit 1 according to the first embodiment can suppress the temperature dependency without including a circuit that requires a power supply, such as a comparator. That is, the input circuit 1 according to the first embodiment realizes suppression of the temperature dependency with a simple circuit configuration, and therefore, the costs associated with the input circuit 1 can be reduced.

[2] Second Embodiment

According to the second embodiment, the input circuit 1 is provided with a circuit for protecting circuitry within it when an excess voltage is input to the input terminal T1. The following description will mainly concentrate on the features of the input circuit 1 according to the second embodiment that differ from the first embodiment.

[2-1] Circuit Configuration of Input Circuit 1

Figure 7:
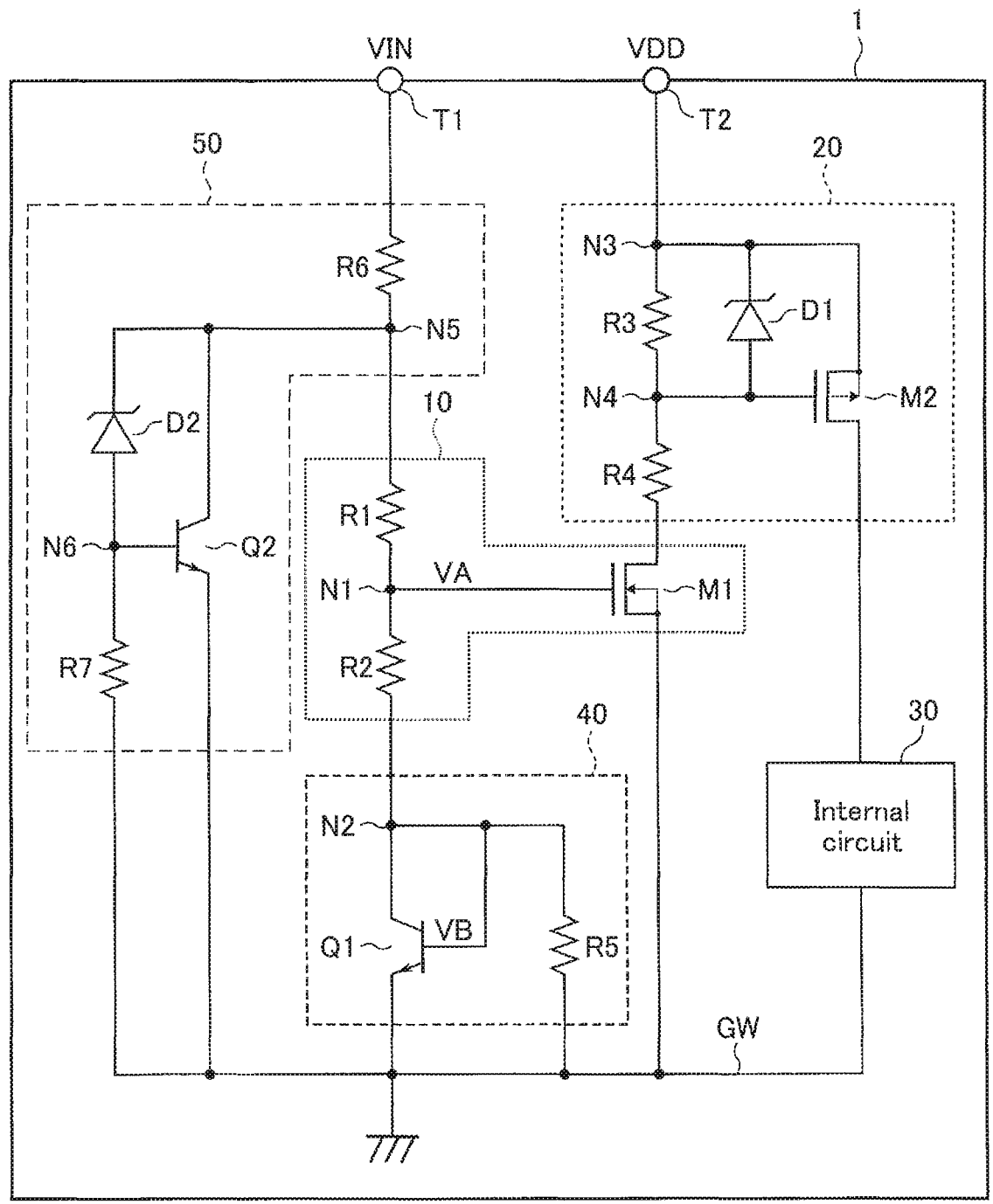
FIG. 7 is a circuit diagram showing one exemplary circuit configuration of an input circuit according to a second embodiment.

FIG. 7 shows one exemplary circuit configuration of the input circuit 1 according to the second embodiment. As shown in FIG. 7, the input circuit 1 according to the second embodiment differs from the input circuit 1 according to the first embodiment in that its circuit configuration additionally includes a protection circuit 50. More specifically, and for example, the protection circuit 50 includes a resistive part R6, a diode D2, a resistive part R7, and a transistor Q2.

The resistive part R6 is electrically connected between the input terminal T1 and the resistive part R1. The diode D2 is a Zener diode. The diode D2 has its cathode connected to a node N5 on the current path between the resistive part R1 and the resistive part R6. The resistive part R7 has one end connected to the anode of the diode D2. The other end of the resistive part R7 is connected to the grounding line GW. The transistor Q2 has its base connected to a node N6 on the current path between the diode D2 and the resistive part R7. The transistor Q2 here is, for example, an NPN-type bipolar transistor. The transistor Q2 has its collector connected to the node N5. The emitter of the transistor Q2 is connected to the grounding line GW. The transistor Q2 may instead be an N-type MOS transistor. For the other respects, the configuration of the input circuit 1 according to the second embodiment is the same as that of the input circuit 1 according to the first embodiment.

[2-2] Operations of Input Circuit 1

The input circuit 1 according to the second embodiment operates in the similar manner as discussed for the first embodiment when the input voltage VIN is lower than the input threshold. That is, in short, the main current path between the input terminal T1 and the grounding line GW is routed through, for example, the resistive parts R6, R1, R2, and R5, and the voltage VA of the node N1 falls below the threshold voltage Vth(M1) of the transistor M1. The transistor M1 in this instance keeps its off state, so that the internal circuit 30 remains in the off state.

The input circuit 1 according to the second embodiment also operates in the similar manner as discussed for the first embodiment when the input voltage VIN exceeds the input threshold and the voltage of the node N5 is lower than the Zener voltage Vz(D2) of the diode D2. That is, in short, the main current path between the input terminal T1 and the grounding line GW is routed through, for example, the resistive parts R6, R1, and R2, and also the transistor Q1, and the voltage VA of the node N1 becomes higher than the threshold voltage Vth(M1) of the transistor M1. Then, for example, the transistor M1 turns to the on state, so that the internal circuit 30 turns to the on state.

In the input circuit 1 according to the second embodiment, two main current paths are formed when the input voltage VIN exceeds the input threshold and the voltage of the node N5 exceeds the Zener voltage Vz(D2) of the diode D2. These two main current paths will be described in detail.

Figure 8:
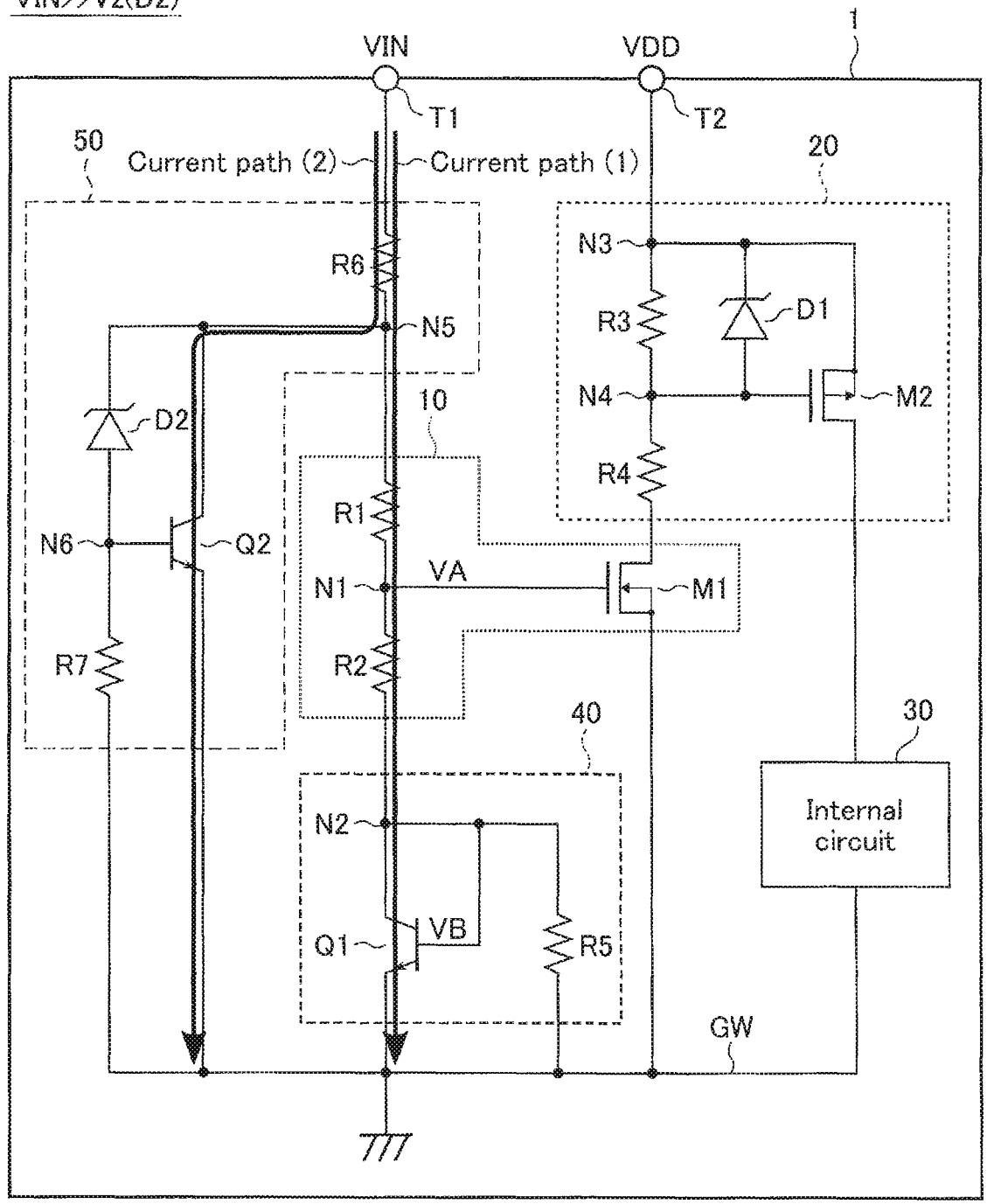
FIG. 8 is a diagram showing one example of current paths during operation of the input circuit according to the second embodiment.

FIG. 8 shows one example of the current paths formed during the operation of the input circuit 1 according to the second embodiment, and this example corresponds to an exemplary operation performed when VIN is higher than Vz(D2) and the voltage of the node N5 is also higher than Vz(D2). As shown in FIG. 8, when VIN is higher than Vz(D2), there are two main current paths between the input terminal T1 and the grounding line GW, namely, the current path (1) through the resistive parts R6, R1, and R2, and the transistor Q1, and the current path (2) through the resistive part R6 and the transistor Q2.

The current path (1) corresponds to the path discussed for the first embodiment, which is formed when the transistor Q1 is in the on state. The current path (2) is a path formed when the voltage of the node N5 exceeds the Zener voltage Vz(D2) of the diode D2. More specifically, when the input voltage VIN is increased and the voltage of the node N5 becomes higher than the Zener voltage Vz(D2), a current flows through the diode D2 and the resistive part R7 between the node N5 and the grounding line GW. In response to this, the voltage of the node N6 increases, and the transistor Q2 transitions from the off state to the on state. When the transistor Q2 becomes the on state, the current path (2) is formed through the transistor Q2 between the node N5 and the grounding line GW. Accordingly, the voltage of the node N5 is kept constant, thanks to the diode D2 and the transistor Q2. In more concrete terms, the voltage of the node D5 is regulated by Vz(D2)+Vth(Q2).

Figure 9:
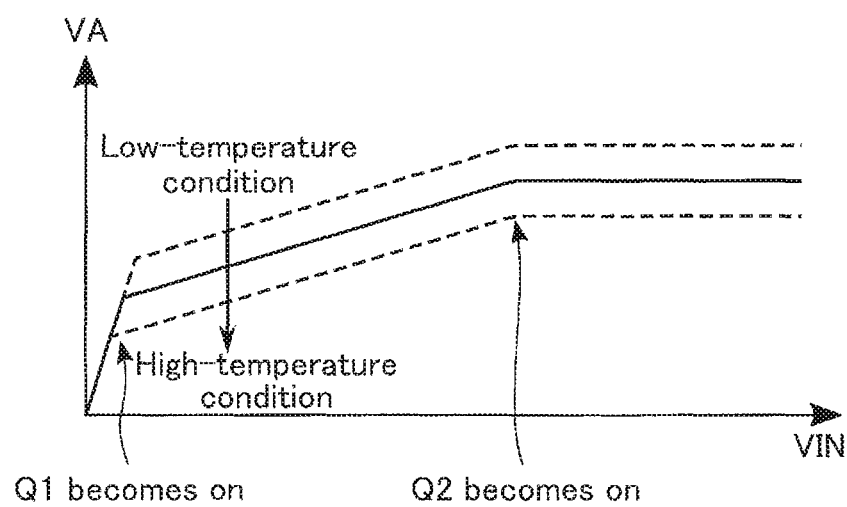
FIG. 9 is a diagram showing one example of a relationship between a gate voltage and an input voltage, together with one example of transistor's temperature dependency, in the input circuit according to the second embodiment.

Upon the voltage of the node N5 having been clamped by the protection circuit 50, the voltage VA of the node N1 is also locked. That is, as shown in FIG. 9, the node N1 will keep the voltage VA substantially constant even if the input voltage VIN is further increased after the operation of the protection circuit 50. In other words, when the voltage of the node N5 exceeds the Zener voltage Vz(D2) of the diode D2 due to the input voltage VIN, the voltage VA of the node N1 is fixed without depending on the input voltage VIN.

[2-3] Effects and Advantages of Second Embodiment

The input circuit 1 employs the input terminal T1 and the power terminal T2 for external connection, which are exposed to possible external factors for causing short-circuiting or sudden application of a high voltage. For example, if short-circuiting occurs between the input terminal T1 and the power terminal T2, the power-supply voltage VDD as a voltage higher than the input voltage VIN is applied to the input terminal T1. The transistor M1, whose gate voltage is controlled by the input voltage VIN, could be broken if a high voltage such as the power-supply voltage VDD is applied.

The input circuit 1 according to the second embodiment thus further includes the protection circuit 50 connected to the path between the input terminal T1 and the node N1 having a connection to the gate of the transistor M1. The protection circuit 50 has a function of sensing the application of an excess voltage to the input terminal T1, and keeping the voltage of the node N5, located between the input terminal T1 and the node N1, constant.

With this configuration, the protection circuit 50 in the input circuit 1 according to the second embodiment can stabilize the voltage VA of the node N1 within the withstanding range for the transistor M1 in the instances where the input terminal T1 is applied with an excess voltage. Therefore, the input circuit 1 according to the second embodiment can suppress the risk of over-voltage application to the transistor M1, and realize enhanced reliability for itself.

[3] Third Embodiment

According to the third embodiment, the input circuit 1 is provided with a circuit for protecting circuitry within it when the input terminal T1 and the power terminal T2 are each applied with a voltage from reverse connection. The following description will mainly concentrate on the features of the input circuit 1 according to the third embodiment that differ from the first and second embodiments.

[3-1] Circuit Configuration of Input Circuit 1

Figure 10:
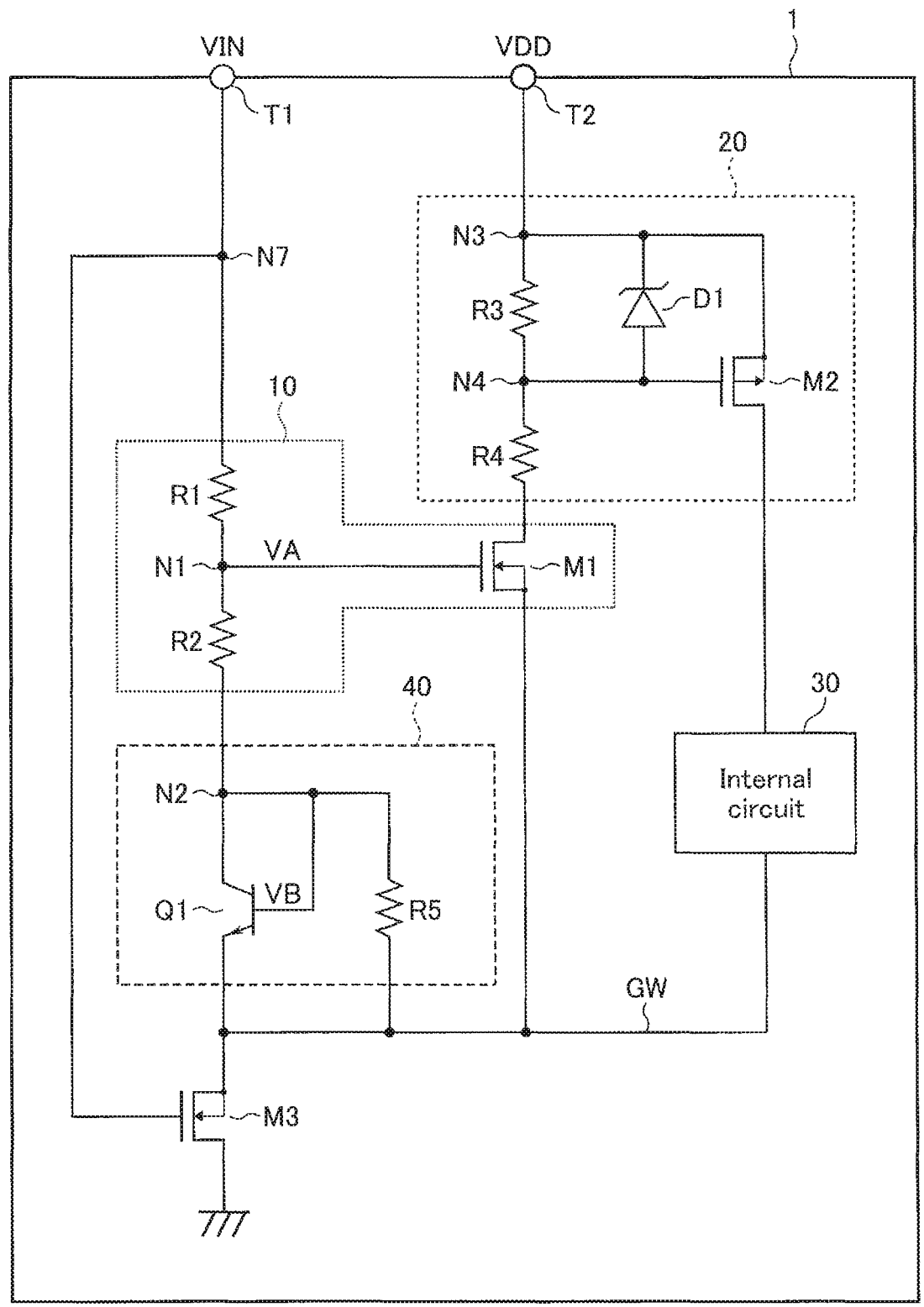
FIG. 10 is a circuit diagram showing one exemplary circuit configuration of an input circuit according to a third embodiment.

FIG. 10 shows one exemplary circuit configuration of the input circuit 1 according to the third embodiment. As shown in FIG. 10, the input circuit 1 according to the third embodiment differs from the input circuit 1 according to the first embodiment in that its circuit configuration additionally includes a transistor M3.

The transistor M3 is, for example, an N-type MOS transistor. The transistor M3 has its gate connected to a node N7 on the current path between the input terminal T1 and the resistive part R1. The source of the transistor M3 is connected to the grounding line GW. The drain of the transistor M3 is grounded. In other words, in the input circuit 1 according to the third embodiment, the gate of the transistor M3 is connected between the resistive part R1 and the input terminal T1, and the grounding line GW is grounded via the transistor M3. For the other respects, the configuration of the input circuit 1 according to the third embodiment is the same as that of the input circuit 1 according to the first embodiment.

[3-2] Operations of Input Circuit 1

The input circuit 1 according to the third embodiment operates in the similar manner as discussed for the first embodiment when a positive voltage is applied to the input terminal T1. That is, in short, the voltage of the node N7 turns to the "H" level when a positive voltage is applied to the input terminal T1, so that the transistor M3 as an N-type transistor is placed in the on state. This forms a current path between the grounding line GW and the ground. The transistor M3 becomes the on state upon the input voltage VIN exceeding the threshold voltage Vth(M3) of the transistor M3, and as such, the input circuit 1 according to the third embodiment takes on the characteristics that the source voltage is higher than in the case of operations as discussed for the first embodiment due to the influence of the parasitic diode between the drain and source of the transistor M3. On the other hand, the transistor M1 has a source voltage substantially equal to the ground voltage when the voltage of the node N1 is near the threshold voltage Vth(M1) of the transistor M1, and therefore, the input circuit 1 according to the third embodiment has the input threshold substantially comparable with that in the first embodiment.

Figure 11:
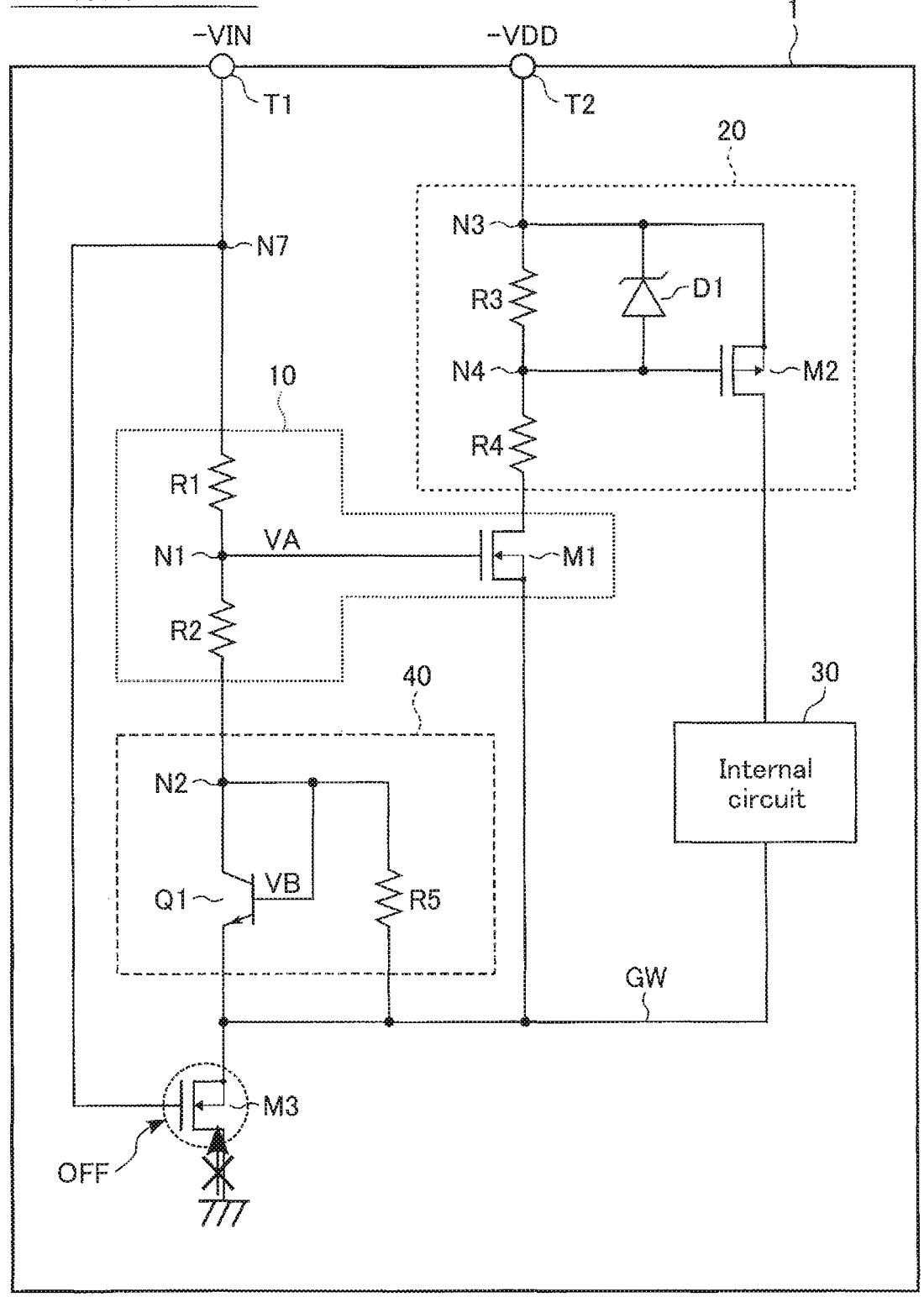
FIG. 11 is a diagram showing one example of an operation of the input circuit according to the third embodiment, performed in an event of reverse connection.

A negative voltage could be applied to the input terminal T1 of the input circuit 1 in the event, for example, that a host device is reversely connected to the input terminal T1. FIG. 11 shows one exemplary operation of the input circuit 1 according to the third embodiment, performed in the event of reverse connection, and it assumes an instance where a negative input voltage −VIN is applied to the input terminal T1 and a negative power-supply voltage −VDD is applied to the power terminal T2.

As shown in FIG. 11, when the negative input voltage −VIN is applied to the input terminal T1, which means a situation where the voltage applied to the input terminal T1 is lower than the ground potential of the input circuit 1, the current path is blocked by the transistor M3. More specifically, when the negative input voltage −VIN is applied to the input terminal T1, the voltage of the node N7 turns to a negative voltage. This makes the N-type transistor M3 deeply the off state, and the current path between the ground of the input circuit 1 and the grounding line GW is blocked. That is, a current flowing from the grounding line GW to the input terminal T1 via the adjusting circuit 40 and the input section 10, and a current flowing from the grounding line GW to the power terminal T2 via the input section 10, the internal circuit 30, and the power supply section 20 are both shut off.

[3-3] Effects and Advantages of Third Embodiment

The input circuit 1 employs the input terminal T1 and the power terminal T2 for external connection, which are exposed to possible incidents of reverse connection with other devices. For example, if a device is reversely connected with the input terminal T1 and the power terminal T2, each of the input terminal T1 and the power terminal T2 is applied with a large negative voltage. Such application of a negative voltage to each of the input terminal T1 and the power terminal T2 would break the elements in the input circuit 1.

The input circuit 1 according to the third embodiment thus further includes the transistor M3 connected between the grounding line GW and the ground. The gate of the transistor M3 is connected to the node N7 located between the input terminal T1 and the input section 10, and immediately senses the application of a negative voltage from reverse connection. Responsive to this application of a negative voltage from reverse connection, the transistor M3 blocks the current path between the grounding line GW and the ground.

With this configuration, the input circuit 1 according to the third embodiment can prevent a reverse current from flowing through each of the input section 10, the power supply section 20, the internal circuit 30, and the adjusting circuit 40, and accordingly protect these circuitry elements. Therefore, the input circuit 1 according to the third embodiment can suppress the risk of internal circuitry breakdown due to the reverse connection, and realize enhanced reliability for itself.

Note that the input circuit 1 according to the third embodiment has assumed the configuration where the gate of the transistor M3 is connected to the node N7 located between the input terminal T1 and the input section 10, but this is for illustration and not a limitation. For example, the transistor M3 may have its gate connected to a node arranged between the power terminal T2 and the power supply section 20. Also, the input circuit 1 may include multiple transistors each corresponding to the transistor M3. In this case, such transistors corresponding to the transistor M3 are connected to, for example, a node located between the input terminal T1 and the input section 10, and a node located between the power terminal T2 and the power supply section 20, respectively.

[4] Fourth Embodiment

According to the fourth embodiment, the input circuit 1 is provided with a circuit by which the input threshold for the internal circuit 30 to be turned on and the input threshold for the internal circuit 30 to be turned off are shifted with respect to each other. The following description will mainly concentrate on the features of the input circuit 1 according to the fourth embodiment that differ from the first to third embodiments.

[4-1] Circuit Configuration of Input Circuit 1

FIG. 12 shows one exemplary circuit configuration of the input circuit 1 according to the fourth embodiment. As shown in FIG. 12, the input circuit 1 according to the fourth embodiment differs from the input circuit 1 according to the first embodiment in that its circuit configuration additionally includes a Schmitt trigger circuit 60. More specifically, and for example, the Schmitt trigger circuit 60 includes a resistive part R8, and transistors M4 and M5.

The resistive part R8 is electrically connected between the input terminal T1 and the resistive part R1. The transistor M4 is, for example, an N-type MOS transistor. The transistor M4 preferably has a size substantially the same as the transistor M1. The transistor M4 has its gate connected to a node N8 on the current path between the resistive part R1 and the resistive part RB. In the following description, the voltage applied to the gate of the transistor M4, i.e., the voltage of the node N8, will be denoted as "VC".

The drain of the transistor M4 is connected to a node N9 on the current path between the resistive part R4 and the transistor M1. The transistor M5 is, for example, an N-type MOS transistor. The transistor M5 has its gate connected to the internal circuit 30. The drain of the transistor M5 is connected to the source of the transistor M4. The source of the transistor M5 is connected to the grounding line GW. In the input circuit 1 according to the fourth embodiment, the internal circuit 30 when in the off state applies a voltage of "L" level to the gate of the transistor M5, and when in the on state applies a voltage of "H" level to the gate of the transistor M5. For the other respects, the configuration of the input circuit 1 according to the fourth embodiment is the same as that of the input circuit 1 according to the first embodiment.

[4-2] Operations of Input Circuit 1

The input circuit 1 according to the fourth embodiment has the input threshold that takes different values between the time of turning on the internal circuit 30 and the time of turning off the internal circuit 30. More specifically, according to the fourth embodiment, the input threshold for turning on the internal circuit 30 is determined based on the input voltage VIN upon which the transistor M1 is turned on, and the input threshold for turning off the internal circuit 30 is determined based on the input voltage VIN upon which the transistor M4 is turned off. First, FIG. 13 will be used for explaining the details of the operation when turning on the internal circuit 30.

Figure 13:
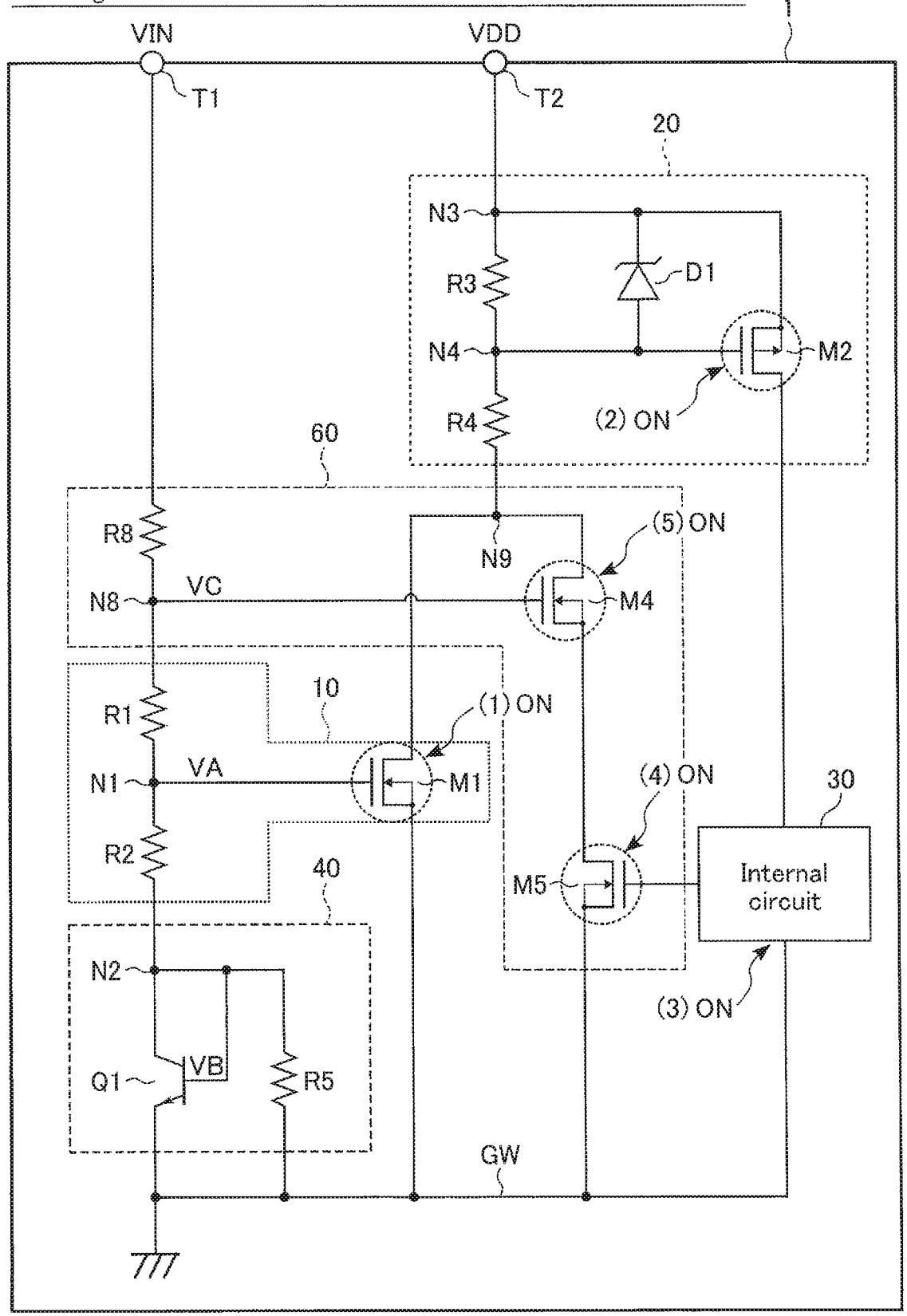
FIG. 13 is a diagram showing one example of an operation of the input circuit according to the fourth embodiment, when an input voltage is increased to cause an internal circuit to transition from an off state to an on state.

FIG. 13 shows one example of the operation of the input circuit 1 according to the fourth embodiment, when the input voltage VIN is increased to cause the internal circuit 30 to transition from the off state to the on state. As shown in FIG. 13, when the input voltage VIN is increased from the ground voltage, the transistor M1 is placed in the on state first ("(1) ON"). At this time, the transistor M4 connected to the node N8 having a higher potential than the node N1 remains in the off state since the transistor M5 is in the off state. Upon the transistor M1 becoming the on state, the voltage of the node N4 descends as in the first embodiment, so that the transistor M2 is placed in the on state ("(2) ON").

The supply of power to the internal circuit 30 is thus initiated, placing the internal circuit 30 in the on state ("(3) ON"). The internal circuit 30 having become the on state raises the gate voltage of the transistor M5 to the "H" level. This places the transistor M5 in the on state ("(4) ON"), and a current path is formed between the source of the transistor M4 and the grounding line GW. When the source potential of the transistor M4 descends, the gate and source of the transistor M4 increase their difference in voltage, so that the transistor M4 is placed in the on state ("(5) ON").

When the transistors M4 and M5 become the on state, two current paths are formed between the power terminal T2 and the grounding line GW, namely, the path routed through the transistor M1 and the path routed through the transistors M4 and M5. Next, FIG. 14 will be used for explaining the details of the operation when turning off the internal circuit 30.

Figure 14:
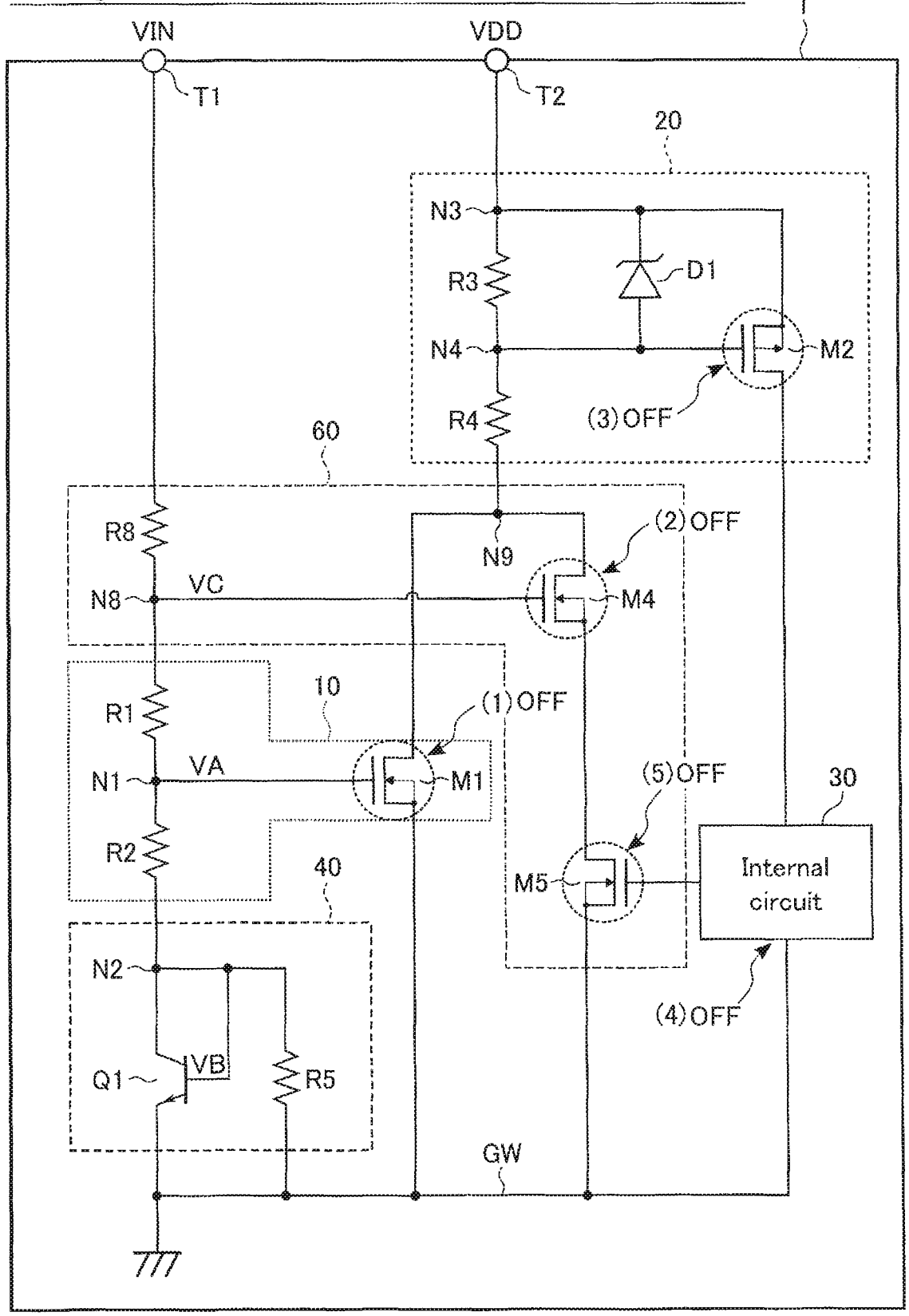
FIG. 14 is a diagram showing one example of an operation of the input circuit according to the fourth embodiment, when the input voltage is decreased to cause the internal circuit to transition from the on state to the off state.

FIG. 14 shows one example of the operation of the input circuit 1 according to the fourth embodiment, when the input voltage VIN is decreased to cause the internal circuit 30 to transition from the on state to the off state. As shown in FIG. 14, when the input voltage VIN is decreased from the operating condition of the internal circuit 30, the transistor M1 is placed in the on off state first ("(1) OFF"). At this time, the transistor M4 connected to the node N8 having a higher potential than the node N1 remains in the on state since the transistor M5 is in the on state. This keeps the voltage of the node N4 at the "L" level, and the transistor M2 remains in the on state.

When the input voltage VIN is further decreased after the transistor M1 becoming the off state, the transistor M4 is placed in the off state ("(2) OFF"). The transistor M2 then becomes the off state ("(3) OFF") due to the voltage of the node N4 increasing, and the internal circuit 30 is placed in the off state ("(4) OFF") because of the stop of the current supply to the internal circuit 30. As a result, the internal circuit 30 halts its voltage application to the transistor M5 so that the transistor M5 is placed in the off state ("(5) OFF").

For the input circuit 1 according to the fourth embodiment having been described, the relationship between the input voltage VIN and the state of the internal circuit 30 is read from FIG. 15. In FIG. 15, the vertical axis indicates the two states of the internal circuit 30, i.e., the on state and the off state, and the horizontal axis indicates the input voltage VIN. According to the fourth embodiment as shown in FIG. 15, the input threshold Von for turning on the internal circuit 30 is higher than the input threshold Voff for turning off the internal circuit 30. Following expressions permit calculations of Von and Voff, respectively.

$$Von = (Vth(M1) - Vth(Q1)) * (R8 + R1 + R2)/R2 + Vth(Q1) \quad (4)$$

$$Voff = (Vth(M4) - Vth(Q1)) * (R8 + R1 + R2)/(R1 + R2) + Vth(Q1) \quad (5)$$

Note that these expressions (4) and (5) assume Vth(M1)=Vth(M4). In the input circuit 1 according to the fourth embodiment, the difference between Von and Voff, that is, the difference between the input threshold for turning on the internal circuit 30 and the input threshold for turning off the internal circuit 30, corresponds to a hysteresis width.

[4-3] Effects and Advantages of Fourth Embodiment

As described above, the input circuit 1 according to the fourth embodiment has a hysteresis width in the characteristics of the input threshold. This can prevent the internal circuit 30 from being unstable between the on state and the off state due to fluctuation of the input voltage VIN. In other words, the input circuit 1 according to the fourth embodiment can suppress the chattering in the vicinity of the input threshold. The input circuit 1 according to the fourth embodiment can therefore realize further enhancement of operational stability in addition to the effects as discussed for the first embodiment.

[5] Others

An input circuit according to a certain embodiment includes an input terminal, a power terminal, an internal circuit, an input section, a power supply section, and a first circuit. There is a grounding line <e.g., GW in FIG. 1> connected to the ground. The internal circuit <e.g., 30 in FIG. 1> is connected to the grounding line. The input section <e.g., 10 in FIG. 1> includes a first resistive part, a second resistive part, and a first transistor. One end of the first resistive part is connected to the input terminal. One end of the second resistive part is connected to the other end of the first resistive part. The gate of the first transistor is connected to the other end of the first resistive part. The power supply section <e.g., 20 in FIG. 1> includes a third resistive part, a fourth resistive part, and a second transistor. One end of the third resistive part is connected to the power terminal. One end of the fourth resistive part is connected to the other end of the third resistive part. The other end of the fourth resistive part is connected to one end of the first transistor. The gate of the second transistor is connected to the other end of the third resistive part. One end of the second transistor is connected to the power terminal. The other end of the second transistor is connected to the internal circuit. The first circuit <e.g., 40 in FIG. 1> includes a fifth resistive part and a third transistor. One end of the fifth resistive part is connected to the other end of the second resistive part. The other end of the fifth resistive part is connected to the grounding line. The gate and one end of the third transistor are connected to the other end of the second resistive part. The other end of the third transistor is connected to the grounding line. With this configuration, the temperature dependency of the input circuit 1 can be suppressed.

The foregoing embodiments tolerate combinations. For example, in each case of the second embodiment and the fourth embodiment, the input circuit 1 may include the transistor M3 according to the third embodiment. The input circuit 1 according to the second embodiment may include the Schmitt trigger circuit 60 according to the fourth embodiment. For the combination of the second embodiment and the fourth embodiment, the node N5 according to the second embodiment is arranged between, for example, the input terminal T1 and the resistive part R8 according to the fourth embodiment. The input circuit 1 obtained by combining all the second to fourth embodiments can provide all the effects and advantages explained for the first to fourth embodiments.

Note that the foregoing embodiments have assumed the configuration where the resistive part R5 is connected to the node N2, but this is for illustration and not a limitation. The embodiments serve the purpose if the resistive part R5 is at least connected to a node between the input terminal T1 and the transistor Q1. This allows for the prevention of an unstable voltage of the node between the input terminal T1 and the transistor Q1 before the transistor Q1 reaches the on state, and two current paths as discussed for the first embodiment can be formed.

In the context of the disclosure herein, a voltage of the "H" level is a voltage which when applied to the gate of an N-type MOS transistor and the gate of an NPN-type bipolar transistor, places these transistors in the on state, and when applied to the gate of a P-type MOS transistor and the gate of a PNP-type bipolar transistor, places these transistors in the off state. A voltage of the "L" level is a voltage which when applied to the gate of an N-type MOS transistor and the gate of an NPN-type bipolar transistor, places these transistors in the off state, and when applied to the gate of a P-type MOS transistor and the gate of a PNP-type bipolar transistor, places these transistors in the on state.

In the context of the disclosure herein, the threshold voltage Vth of a bipolar transistor corresponds to, when a voltage of the base is subject to change, a voltage value which causes a current flowing between the collector and emitter to exceed a predetermined value, namely, a voltage value to place this bipolar transistor in the on state. The threshold voltage Vth of a MOS transistor corresponds to, when a voltage of the gate is subject to change, a voltage value which causes a current flowing between the drain and source to exceed a predetermined value, namely, a voltage value to place this MOS transistor in the on state.

In the context of the disclosure herein, a resistive part may be formed on a substrate constituting the input circuit 1, or may be provided as a discrete element mounted on the substrate. Similarly, a transistor may be formed on the substrate constituting the input circuit 1, or may be provided as a discrete element mounted on the substrate. The foregoing embodiments remain valid even if the internal circuit 30 is provided as a circuit externally connected to the input circuit 1. A ground refers to a portion in the input circuit 1 that corresponds to the ground voltage. When the description uses the expression "grounded", a connection to the ground in the input circuit 1 is meant.

In the context of the disclosure herein, "one end" of a transistor refers to a drain or a source when the transistor is a MOS transistor, and refers to a collector or an emitter when the transistor is a bipolar transistor. Also, the "other end" or "remaining end" of a transistor refers to a source or a drain when the transistor is a MOS transistor, and refers to an emitter or a collector when the transistor is a bipolar transistor. Further, the "gate" of a transistor refers to a gate when the transistor is a MOS transistor, and refers to a base when the transistor is a bipolar transistor.

In the context of the disclosure herein, the expression "connection", "connected", or the like indicate electrical connection, and does not exclude the forms where, for example, other element or elements are interposed between the connected elements. Also, the description uses the term "on state" to indicate a state of the corresponding transistor where its gate is under application of a voltage equal to or higher than its threshold voltage. Also, the description uses the term "off state" to indicate a state of the corresponding transistor where its gate is under application of a voltage lower than its threshold voltage, and this state does not exclude the instances where a subtle amount of current such as a transistor's leak current flows.

While certain embodiments have been described, they have been presented by way of example only, and are not intended to limit the scope of the inventions. Indeed, the novel embodiments described herein may be embodied in a variety of other forms. Furthermore, various omissions, substitutions, and changes in the form of the embodiments may be made without departing from the spirit of the inventions. The accompanying claims and their equivalents are intended to cover such forms or modifications as would fall within the scope and the spirit of the inventions.

What is claimed is:

1. An input circuit comprising:
an input terminal;
a power terminal;
a grounding line connected to a ground;
an internal circuit connected to the grounding line;
an input section comprising a first resistive part, a second resistive part, and a first transistor, with one end of the first resistive part connected to the input terminal, one end of the second resistive part connected to a remaining end of the first resistive part, and a gate of the first transistor connected to said remaining end of the first resistive part;
a power supply section comprising a third resistive part, a fourth resistive part, and a second transistor, with one end of the third resistive part connected to the power terminal, one end of the fourth resistive part connected to a remaining end of the third resistive part, a remaining end of the fourth resistive part connected to one end of the first transistor, a gate of the second transistor connected to said remaining end of the third resistive part, one end of the second transistor connected to the power terminal, and a remaining end of the second transistor connected to the internal circuit; and
a first circuit comprising a fifth resistive part and a third transistor, with one end of the fifth resistive part connected to a remaining end of the second resistive part, a remaining end of the fifth resistive part connected to the grounding line, a gate and one end of the third transistor connected to said remaining end of the second resistive part, and a remaining end of the third transistor connected to the grounding line.

2. The input circuit of claim 1, wherein
the first transistor is an N-type MOS transistor, and
the third transistor is an NPN-type bipolar transistor.

3. The input circuit of claim 1, wherein
the first transistor has a threshold voltage higher than a threshold voltage of the third transistor.

4. The input circuit of claim 1, wherein
the third transistor has an on-resistance smaller than a resistance value of the fifth resistive part.

5. The input circuit of claim 1, wherein
the power supply section further comprises a first Zener diode, with an anode of the first Zener diode connected to the gate of the second transistor, and a cathode of the first Zener diode connected to the power terminal.

6. The input circuit of claim 1, wherein
the second transistor is a P-type MOS transistor.

7. The input circuit of claim 1, configured so that
the first transistor and the third transistor each become off in response to the input terminal applied with a voltage lower than a first voltage,
the first transistor becomes off and the third transistor becomes on in response to the input terminal applied with a voltage equal to or higher than the first voltage and lower than a second voltage, and
the first transistor and the third transistor each become on in response to the input terminal applied with a voltage equal to or higher than the second voltage.

8. The input circuit of claim 7, configured so that
in response to the input terminal applied with a voltage lower than the first voltage, the first transistor has a gate voltage that is based on respective resistance values of the first resistive part, the second resistive part, and the fifth resistive part, and
in response to the input terminal applied with a voltage equal to or higher than the first voltage, the first transistor has a gate voltage that is based on the respective resistance values of the first resistive part and the second resistive part and based on an on-resistance of the third transistor.

9. The input circuit of claim 1, configured so that
the internal circuit controls turning on and off a lamp according to an input voltage to the input terminal and an input voltage to the power terminal.

10. The input circuit of claim 1, further comprising
a second circuit comprising a second Zener diode, a sixth resistive part, and a fourth transistor, with a cathode of the second Zener diode connected between the input terminal and the first resistive part, one end of the sixth resistive part connected to an anode of the second Zener diode, a remaining end of the sixth resistive part connected to the grounding line, a gate of the fourth transistor connected to the anode of the second Zener diode, one end of the fourth transistor connected to the cathode of the second Zener diode, and a remaining end of the fourth transistor connected to the grounding line.

11. The input circuit of claim 10, wherein
the fourth transistor is an NPN-type bipolar transistor.

12. The input circuit of claim 10, configured so that
the third transistor and the fourth transistor each become off in response to the input terminal applied with a voltage lower than a first voltage,
the third transistor becomes on and the fourth transistor becomes off in response to the input terminal applied with a voltage equal to or higher than the first voltage and lower than a third voltage, and
the third transistor and the fourth transistor each become on in response to the input terminal applied with a voltage equal to or higher than the third voltage.

13. The input circuit of claim 12, configured so that
in response to the input terminal applied with a voltage lower than the first voltage, the first transistor has a gate voltage that is based on respective resistance values of the first resistive part, the second resistive part, and the fifth resistive part,
in response to the input terminal applied with a voltage equal to or higher than the first voltage and lower than the third voltage, the first transistor has a gate voltage that is based on the respective resistance values of the first resistive part and the second resistive part and based on an on-resistance of the third transistor, and
in response to the input terminal applied with a voltage equal to or higher than the third voltage, the first transistor has a gate voltage that is based on the respective resistance values of the first resistive part and the second resistive part and based on the on-resistance of the third transistor and an on-resistance of the fourth transistor.

14. The input circuit of claim 13, configured so that
the gate voltage of the first transistor in response to the input terminal applied with a voltage equal to or higher than the third voltage is substantially constant.

15. The input circuit of claim 1, further comprising
a fifth transistor, with a gate of the fifth transistor connected between the input terminal and the first resistive part, one end of the fifth transistor connected to the grounding line, and a remaining end of the fifth transistor connected to the ground,
wherein the grounding line and the ground are connected via the fifth transistor.

16. The input circuit of claim 15, wherein
the fifth transistor is an N-type MOS transistor.

17. The input circuit of claim 15, configured so that
the fifth transistor protects the internal circuit in an event of application of a negative voltage to the input terminal, the power terminal, or both of the input terminal and the power terminal.

18. The input circuit of claim 1, further comprising
a third circuit comprising a seventh resistive part, a sixth transistor, and a seventh transistor, with the seventh resistive part connected between the input terminal and said one end of the first resistive part, a gate of the sixth transistor connected to said one end of the first resistive part, one end of the sixth transistor connected to said remaining end of the fourth resistive part, a gate of the seventh transistor connected to the internal circuit, one end of the seventh transistor connected to a remaining end of the sixth transistor, and a remaining end of the seventh transistor connected to the grounding line,
wherein the input circuit is configured so that
the internal circuit controls the seventh transistor to be off in an absence of power from the second transistor, and
the internal circuit controls the seventh transistor to be on in a presence of power from the second transistor.

19. The input circuit of claim 18, wherein
the first transistor, the sixth transistor, and the seventh transistor are each an N-type MOS transistor.

20. The input circuit of claim 18, wherein
a voltage for turning on the internal circuit in a course of an input voltage to the input terminal increased from a first voltage to a fourth voltage is higher than a voltage for turning off the internal circuit in a course of the input voltage to the input terminal decreased from the fourth voltage to the first voltage.

* * * * *